United States Patent [19]
Ichiyoshi

[11] Patent Number: 6,009,313
[45] Date of Patent: Dec. 28, 1999

[54] RADIO COMMUNICATION DEVICE CAPABLE OF SETTING A FREQUENCY CHANNEL WITH A SMALL FREQUENCY STEP

[75] Inventor: Osamu Ichiyoshi, Tokyo, Japan

[73] Assignee: NEC Corporation, Japan

[21] Appl. No.: 08/886,954

[22] Filed: Jul. 2, 1997

[30] Foreign Application Priority Data

Jul. 2, 1996 [JP] Japan .................................. 8-172419

[51] Int. Cl.[6] .............................. H04B 1/26; H04N 5/50
[52] U.S. Cl. ............................ 455/76; 455/84; 455/86; 455/112
[58] Field of Search .............................. 455/76, 84, 86, 455/112, 118, 119

[56] References Cited

U.S. PATENT DOCUMENTS

| | | | |
|---|---|---|---|
| 5,390,346 | 2/1995 | Marz ....................................... | 455/260 |
| 5,465,409 | 11/1995 | Borras et al. ............................ | 455/260 |
| 5,483,679 | 1/1996 | Sasaki ...................................... | 455/86 |
| 5,669,067 | 9/1997 | Mambo .................................... | 455/76 |
| 5,715,520 | 2/1998 | Hillock et al. ........................... | 455/76 |
| 5,722,053 | 2/1998 | Kornfeld et al. ........................ | 455/86 |
| 5,737,694 | 4/1998 | McMahill et al. ....................... | 455/76 |
| 5,794,119 | 8/1998 | Evans et al. ............................ | 455/6.2 |
| 5,794,131 | 8/1998 | Cairns ..................................... | 455/76 |

FOREIGN PATENT DOCUMENTS

| | | |
|---|---|---|
| 58-148531 | 9/1983 | Japan . |
| 61-216529 | 9/1986 | Japan . |
| 6-26329 | 4/1994 | Japan . |
| 2278511 | 11/1994 | United Kingdom . |

OTHER PUBLICATIONS

J.A. Crawford, "Frequency Synthesizer Design Handbook", Artech, p. 289.

Primary Examiner—David R. Hudspeth
Assistant Examiner—Vijay B. Chawan
Attorney, Agent, or Firm—Ostrolenk, Faber, Gerb & Soffen, LLP

[57] ABSTRACT

A radio communication device includes a transmission carrier generating circuit, a reception intermediate-frequency local signal generating circuit), a transmission radio-frequency local signal generating circuit and a reception radio-frequency local signal generating circuit, each of which is in the form of a frequency synthesizer. The radio communication device further includes a channel connection signal control circuit which cooperatively controls the transmission carrier generating circuit and the transmission radio-frequency local signal generating circuit and cooperatively controls the reception intermediate-frequency local signal generating circuit and the reception radio-frequency local signal generating circuit.

12 Claims, 9 Drawing Sheets

TX/RX INDEPENDENT LOCAL

FIG. 3B

COMMON LOCAL

FIG. 3C

COMMON LOCAL/DIRECT FREQUENCY CONVERSION RECEPTION

RADIO COMMUNICATION DEVICE CAPABLE OF SETTING A FREQUENCY CHANNEL WITH A SMALL FREQUENCY STEP

BACKGROUND OF THE INVENTION

The present invention relates to a radio communication device for use in a radio communication system.

A frequency division multiplex system with small frequency pitches has been widely available due to increasing channel capacity in a mobile communication and in consideration of the signal power in the mobile satellite communication. In such a communication system, a frequency synthesizer with small frequency steps is required.

However, conventional radio communication devices have the following drawbacks:

The first problem will be explained hereinbelow. Since the setting of channel frequencies is carried out by a single frequency synthesizer, if the frequency step is set small, phase noise of the signal is increased. In a synchronous detection demodulation mode required in the system where the channel has a narrow band and the power is limited, an influence of phase noise is more liable and thus more serious.

Now, the second problem will be explained hereinbelow. For reduction in size of a communication terminal in the radio communication system, a TDMA/FDMA system in combination of a time division multiplex (TDMA) system and the frequency division multiplex (FDMA) system has been widely available since a duplexer can be constituted by a simple radio-frequency switch. In the TDMA/FDMA system, a frequency synthesizer capable of high-speed frequency switching is required for preventing interference between users. However, reduction in frequency pitch and reduction in frequency switching time belong to conflicting requirements and are difficult to achieve from a technical point of view.

Finally, the third problem will be explained hereinbelow. For solving the foregoing problems, a method has been taken wherein the frequency synthesizer has a double-loop structure. Such a double-loop type frequency synthesizer is described in "Frequency Synthesizer Design Handbook, page 289" by James A. Crawford, Artech House (hereinafter referred to as "Prior Art 1").

The method of using the double-loop structure gives a tentative solution from a technical point of view, which, however, requires a complicated device structure due to the double-loop structure.

SUMMARY OF THE INVENTION

It is therefore an object of the present invention to provide an improved radio communication device which is capable of setting a frequency channel with a small frequency step.

It is another object of the present invention to provide an improved radio communication device whose phase noise is small.

It is still another object of the present invention to provide an improved radio communication device which is simple in structure and capable of high-speed frequency switching.

Other objects of this invention will be clear as the description proceeds.

According to one aspect of the present invention, a radio communication device which comprises a carrier generating circuit for generating a transmit carrier signal, the carrier generating circuit comprising a first frequency synthesizer capable of varying an intermediate frequency of the transmit carrier signal using a first step frequency; a radio-frequency local signal generating circuit for generating a radio-frequency local signal, the radio-frequency local signal generating circuit comprising a second frequency synthesizer capable of varying a radio frequency of the radio-frequency local signal using a second step frequency different from the first step frequency; a transmitting section connected to the carrier generating and the radio-frequency local signal generating circuits for generating a transmit radio-frequency signal in response to the transmit carrier signal and the radio-frequency local signal with a frequency up-conversion to transmit the transmit radio-frequency signal; and a control circuit connected to the first and the second frequency synthesizers for cooperatively controlling the first and the second frequency synthesizers.

According to another aspect of this invention, there is provided a radio communication device which comprises a radio-frequency local signal generating circuit for generating a radio-frequency local signal, the radio-frequency local signal generating circuit comprising a first frequency synthesizer capable of varying a radio frequency of the radio-frequency local signal using a first step frequency; a reception intermediate-frequency local signal generating circuit for generating a receive intermediate-frequency local signal, the reception intermediate-frequency local signal generating circuit comprising a second frequency synthesizer capable of varying an intermediate frequency of the receive intermediate-frequency local signal using a second step frequency different from the first step frequency; a receiving section connected to the radio-frequency local signal generating and the reception intermediate-frequency local signal generating circuits for receiving a receive radio-frequency signal to produce a receive baseband signal in response to the radio-frequency local signal and the receive intermediate-frequency local signal with a frequency down-conversion of the receive radio-frequency signal; and a control circuit connected to the first and the second frequency synthesizers for cooperatively controlling the first and the second frequency synthesizers.

According to still another aspect of this invention, there is provided a radio communication device which comprises a transmit carrier generating circuit for generating a transmit carrier signal, the transmission carrier generating circuit comprising a first frequency synthesizer capable of varying an intermediate frequency of the transmit carrier signal using a first step frequency; a radio-frequency local signal generating circuit for generating a radio-frequency local signal, the radio-frequency local signal generating circuit comprising a second frequency synthesizer capable of varying a radio frequency of the radio-frequency local signal using a second step frequency different from the first step frequency; a transmitting section for modulating the transmit carrier signal with a transmit baseband signal to produce a transmit intermediate-frequency signal, performing a frequency up-conversion of the transmit intermediate-frequency signal using the radio-frequency local signal to produce a transmit radio-frequency signal and transmitting the transmit radio-frequency signal; a receiving section for receiving a receive radio-frequency signal and demodulating the receive radio-frequency signal using the radio-frequency local signal to produce a receive baseband signal; and a control circuit connected to the first and the second frequency synthesizers for controlling the first and the second frequency synthesizers

BRIEF DESCRIPTION OF THE DRAWING

FIGS. 3A, 3B, and 3C are diagram showing frequency arrangements, wherein

DESCRIPTION OF THE PREFERRED EMBODIMENTS

For better understanding of the present invention, description will be made at first as regards various conventional radio communication devices with reference to the figure.

Figure 1:
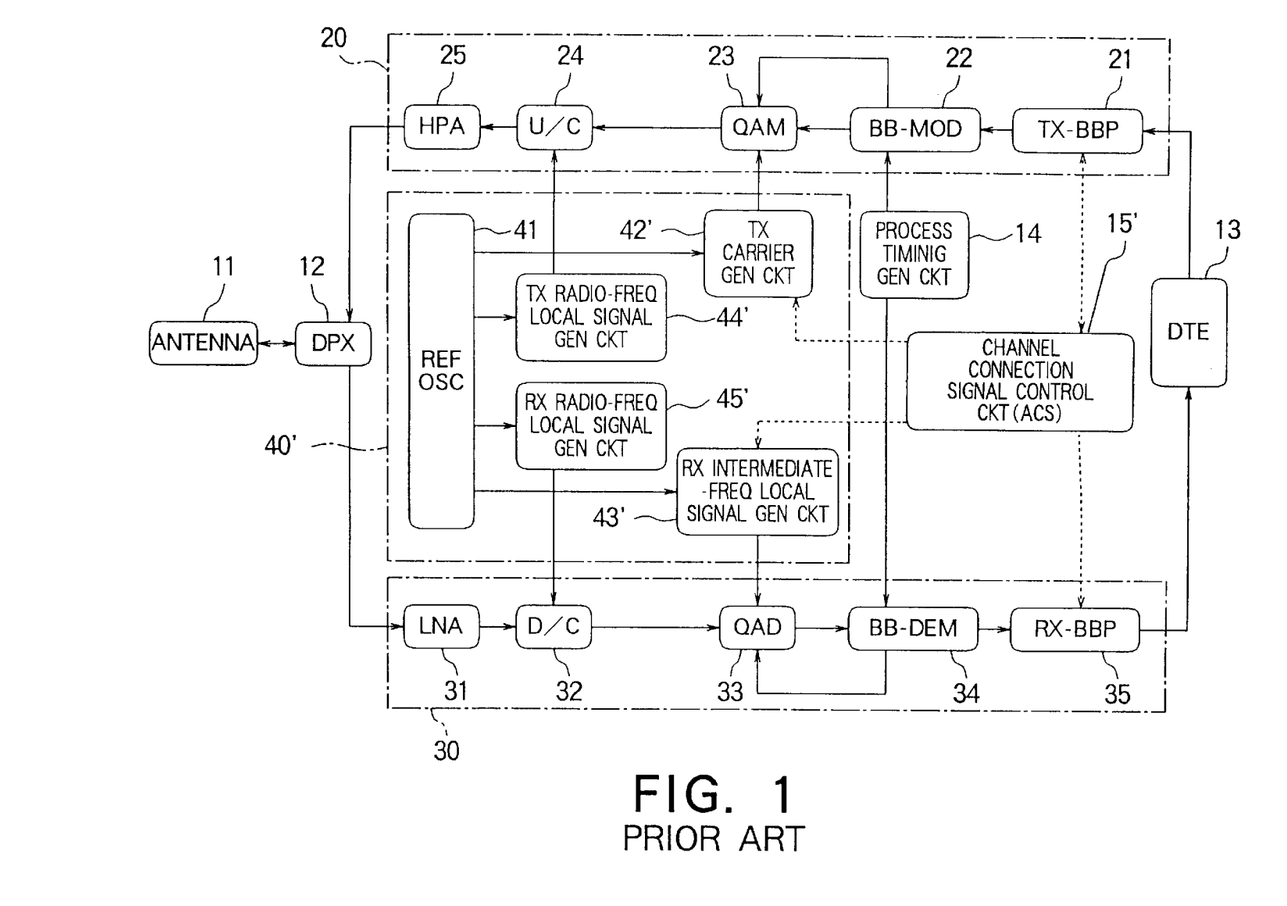
FIG. 1 is a block diagram showing a structure of a first conventional radio communication device.

Referring to FIG. 1, a first conventional radio communication device is for performing a radio communication in connection with a radio communication network and includes an antenna 11, a duplexer (DPX) 12 connected to the antenna 11, a data terminal (DTE) 13, a process timing generating circuit 14, a transmitting section 20 connected between the duplexer 12 and the data terminal 13, a receiving section 30 connected between the duplexer 12 and the data terminal 13, a frequency generating section 40' for feeding a carrier signal and local signals to the transmitting section 20 and the receiving section 30, and a channel connection signal control circuit (ACS) 15'. The data terminal 13 is, for example, a telephone handset.

Figure 3A:
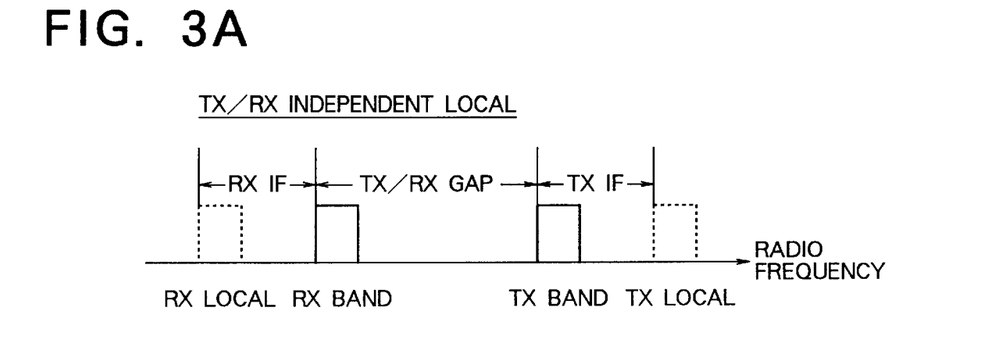
FIG. 3A shows a case in which local signal generating circuits are separately provided in transmission and reception, FIG. 3B showing a case in which a local signal generating circuit is common in transmission and reception, FIG. 3C showing a case in which a local signal generating circuit is common in transmission and reception, and a radio frequency is directly converted to a baseband at a receiving side.

The frequency generating section 40' includes a reference oscillator 41 for generating a reference signal, a transmission (TX) carrier generating circuit 42' for generating a transmit carrier signal based on the reference signal, a reception (RX) intermediate-frequency local signal generating circuit 43' for generating a receive intermediate-frequency local signal based on the reference signal, a transmission radio-frequency local signal generating circuit 44' for generating a transmit radio-frequency local signal based on the reference signal, and a reception radio-frequency local signal generating circuit 45' for generating a receive radio-frequency local signal based on the reference signal. Each of the transmission radio-frequency local signal generating circuit 44' and the reception radio-frequency local signal generating circuit 45' is an oscillating circuit for generating a fixed-frequency signal. Each of the transmission carrier generating circuit 42' and the reception intermediate-frequency local signal generating circuit 43' is a frequency synthesizer which is capable of setting a channel frequency under the control of the channel connection signal control circuit 15'. The frequency arrangement achieved by the radio communication device shown in FIG. 1 is shown at in FIG. 3A. As shown in FIG. 3A, transmission and reception intermediate frequencies (TX/RX IF) can be freely set.

The transmitting section 20 includes a transmission baseband processing circuit (TX-BBP) 21 for converting a signal from the data terminal 13 into a signal format of a communication network to produce a transmit baseband signal, a baseband modulating circuit (BB-MOD) 22 for performing a given modulation, as predetermined in the communication network, of the output from the transmission baseband processing circuit 21, a quadrature amplitude modulating circuit (QAM) 23 for performing a quadrature amplitude modulation of the transmit carrier signal from the transmission carrier generating circuit 42' using an output from the baseband modulating circuit 22 to produce a transmit intermediate-frequency signal, a frequency up-converter (U/C) 24 for performing a frequency up-conversion of the transmit intermediate-frequency signal from the quadrature amplitude modulating circuit 23 using the transmit radio-frequency local signal from the transmission radio-frequency local signal generating circuit 44' to produce a transmit radio-frequency signal having a given radio frequency in the communication network, and a high-power amplifier (HPA) 25 for power-amplifying the output from the frequency up-converter 24 to a given signal power. An output of the high-power amplifier 25 is fed to the antenna 11 via the duplexer 12.

The receiving section 30 includes a low-noise amplifier (LNA) 31 for performing a low-noise amplification of a receive radio-frequency signal with a radio frequency received from the antenna 11 via the duplexer 12, a frequency down-converter (D/C) 32 for performing a frequency down-conversion of an output from the low-noise amplifier 31 using the receive radio-frequency local signal from the reception radio-frequency local signal generating circuit 45' to produce a receive intermediate-frequency signal with an intermediate frequency, a quadrature amplitude demodulating circuit (QAD) 33 for performing a frequency conversion of the receive intermediate-frequency signal from the frequency down-converter 32 using the receive intermediate-frequency local signal from the reception intermediate-frequency local signal generating circuit 43' to produce an A/D-converted complex baseband signal (receive baseband signal), a baseband demodulating circuit (BB-DEM) 34 for demodulating the output from the quadrature amplitude demodulating circuit 33 through digital signal processing, and a reception baseband processing circuit (RX-BBP) 35 for deriving an information signal from a demodulated output from the baseband demodulating circuit 34 through a reverse operation of the transmission baseband processing circuit 21. The output of the reception baseband processing circuit 35 is fed to the data terminal 13 so that a communication service is offered.

Figure 2:
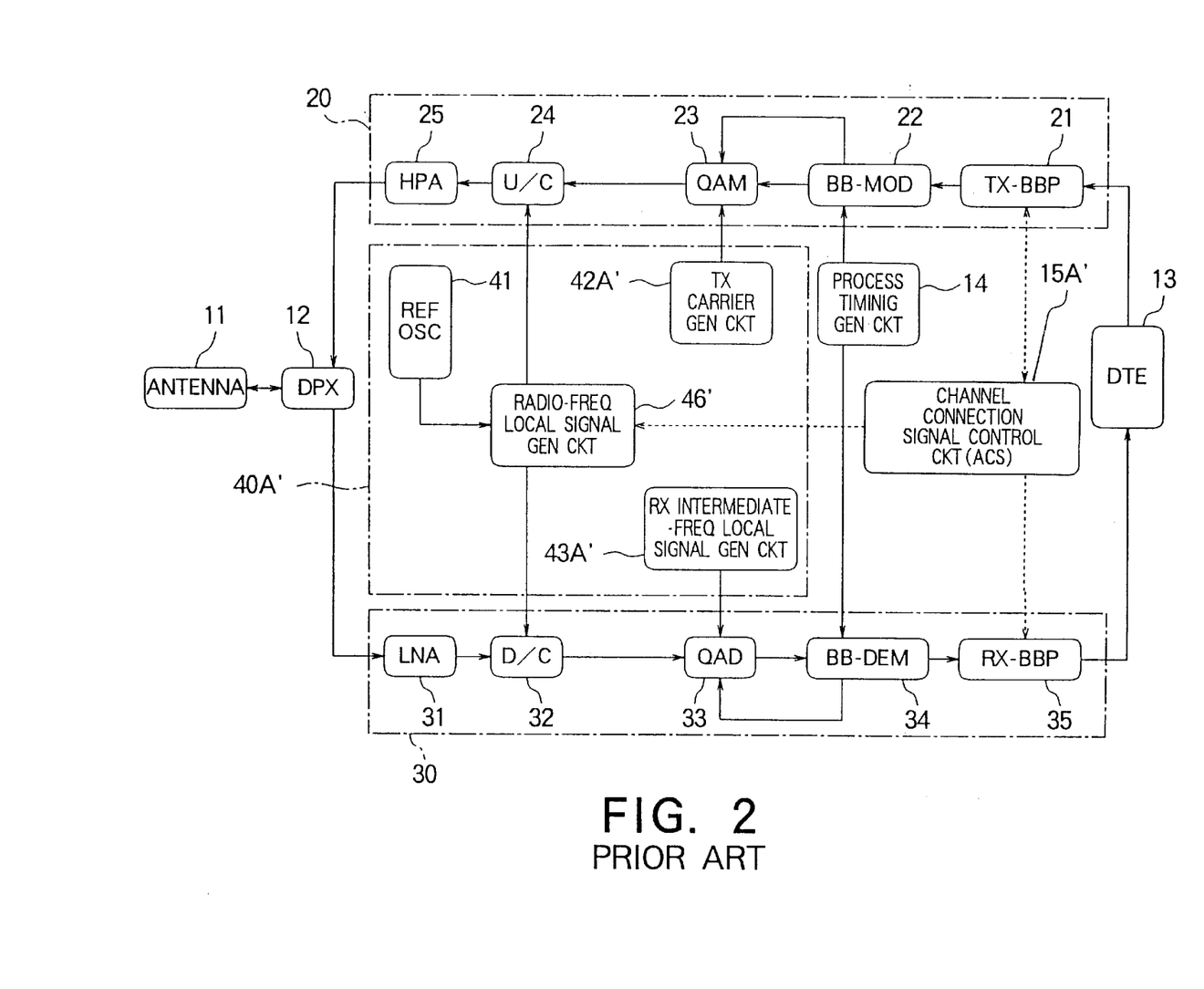
FIG. 2 is a block diagram showing a structure of a second conventional radio communication device.

Referring to FIG. 2, a second conventional radio communication device has the same structure as that shown in FIG. 1 except that the frequency generating section 40' is replaced by a frequency generating section 40A'.

The frequency generating section 40A' includes a reference oscillator 41, a transmission carrier generating circuit 42A', a reception intermediate-frequency local signal generating circuit 43A' and a radio-frequency local signal generating circuit 46'. Specifically, the transmission radio-frequency local signal generating circuit 44' and the reception radio-frequency local signal generating circuit 45' shown in FIG. 1 are replaced by the common radio-frequency local signal generating circuit 46'. The radio-frequency local signal generating circuit 46' is a frequency synthesizer which is capable of setting a channel frequency under the control of a channel connection signal control circuit 15A'. Each of the transmission carrier generating circuit 42A' and the reception intermediate-frequency local signal generating circuit 43A' uses a fixed oscillating circuit which produces a fixed-frequency signal.

Figure 4:
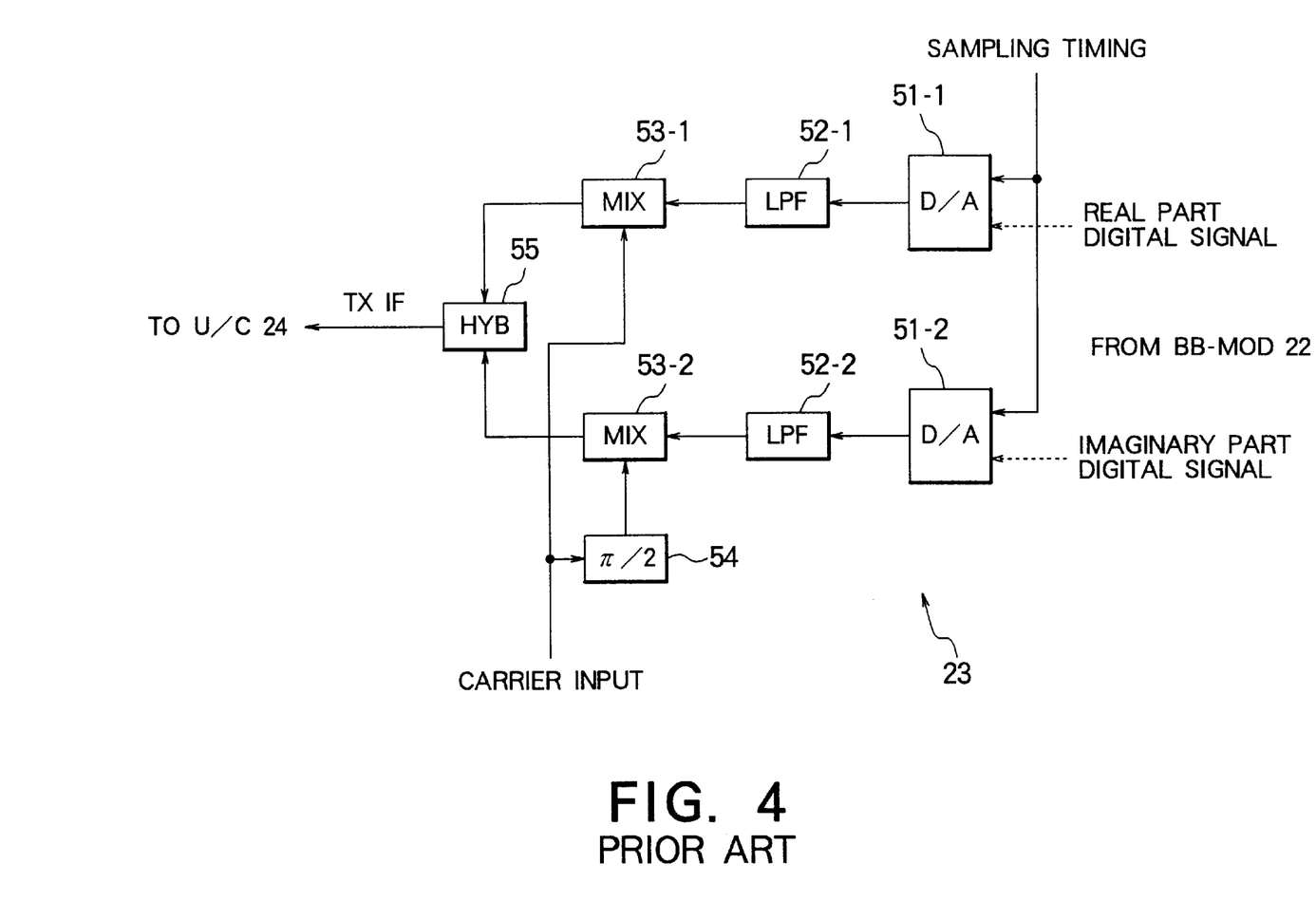
FIG. 4 is a block diagram showing a structure of a quadrature amplitude modulating circuit for use in the radio communication device.

Referring to FIG. 4, the quadrature amplitude modulating circuit 23 will be described. The quadrature amplitude modulating circuit 23 includes first and second D/A converters 51-1 and 51-2, first and second low pass filters (LPF's) 52-1 and 52-2, first and second mixers (MIX's) 53-1 and 53-2, a π/2 phase shifter 54 and a signal synthesizer (HYB) 55.

The first D/A converter 51-1 converts a real part digital signal outputted from the baseband modulating circuit 22 into a real part analog signal based on the sampling timing. The first low pass filter 52-1 smooths the real part analog signal to output a first smoothed signal. The first mixer 53-1 mixes the first smoothed signal and the transmit carrier signal from the transmission carrier generating circuit 42' to output a first modulated signal. Similarly, the second D/A converter 51-2 converts an imaginary part digital signal outputted from the baseband modulating circuit 22 into an imaginary part analog signal based on the sampling timing. The second low pass filter 52-2 smooths the imaginary part analog signal to output a second smoothed signal. The second mixer 53-2 mixes the second smoothed signal and a signal obtained by shifting a phase of the transmit carrier signal from the transmission carrier generating circuit 42' by π/2 through the π/2 phase shifter 54 so as to output a second modulated signal. The signal combiner 55 combines the first and second modulated signals to output a mixed signal as the transmit intermediate-frequency signal TX IF.

Figure 5:
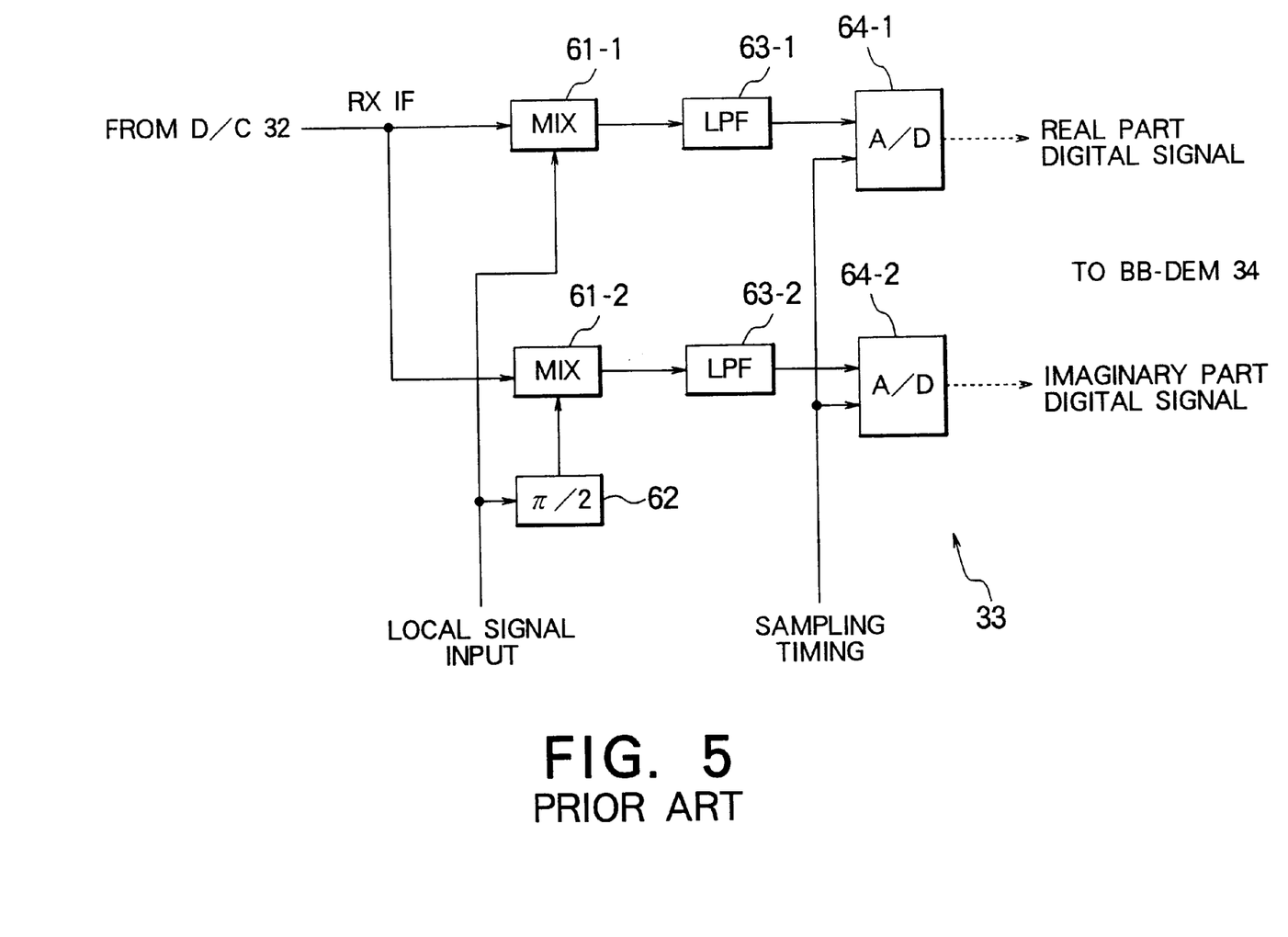
FIG. 5 is a block diagram showing a structure of a quadrature amplitude demodulating circuit for use in the radio communication device.

Referring to FIG. 5, the quadrature amplitude demodulating circuit 33 includes first and second mixers (MIX's) 61-1 and 61-2, a π/2 phase shifter 62, first and second low pass filters (LPF's) 63-1 and 63-2, and first and second A/D converters 64-1 and 64-2.

The first mixer 61-1 mixes the receive intermediate-frequency signal RX IF from the frequency down-converter 32 and the receive intermediate-frequency local signal from the reception intermediate-frequency local signal generating circuit to output a first baseband signal. The first low pass filter 63-1 smooths the first baseband signal to output a first smoothed signal. The first A/D converter 64-1 converts the first smoothed signal into a real part digital signal based on the sampling timing. Similarly, the second mixer 61-2 mixes the receive intermediate-frequency signal RX IF from the frequency down-converter 32 and a signal obtained by shifting a phase of the receive intermediate-frequency local signal from the reception intermediate-frequency local signal generating circuit by π/2 through the π/2 phase shifter 62 so as to output a second baseband signal. The second low pass filter 63-2 smoothes the second baseband signal to output a second smoothed signal. The second A/D converter 64-2 converts the second smoothed signal into an imaginary part digital signal based on the sampling timing.

Figure 6:
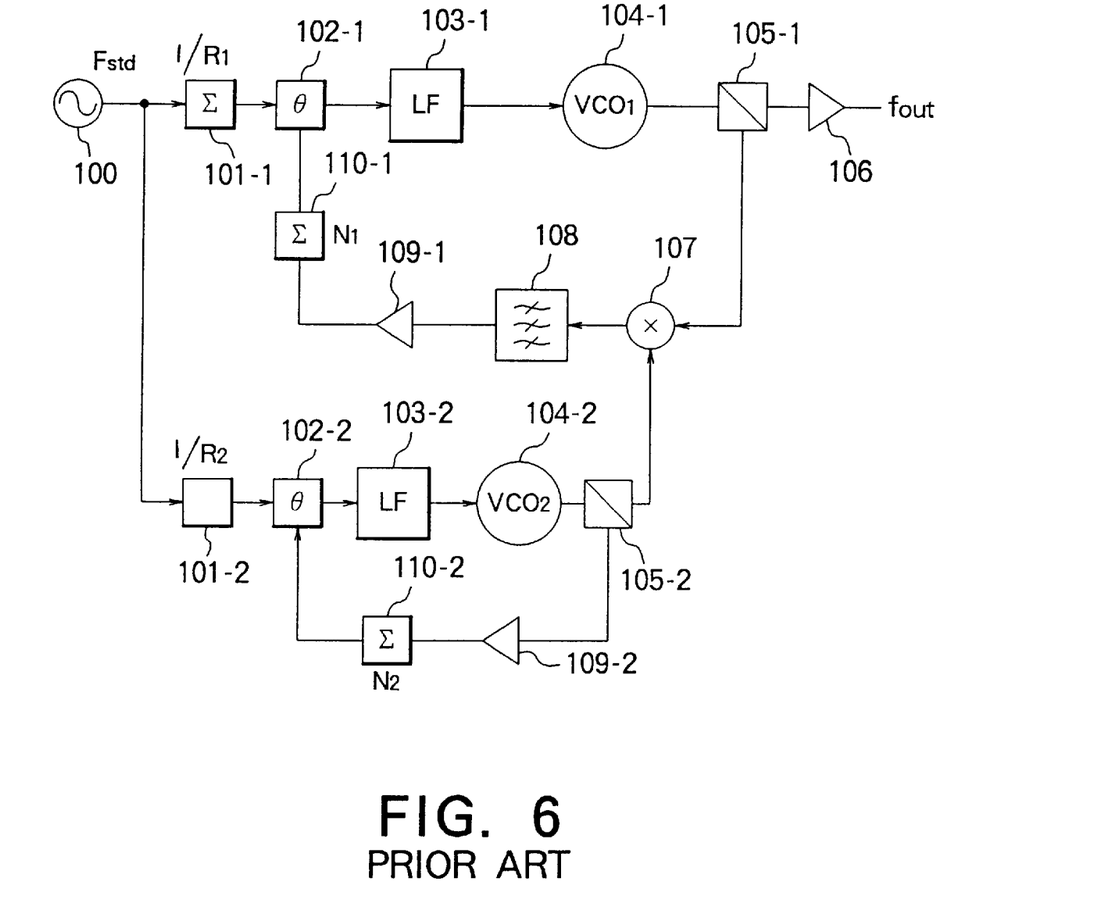
FIG. 6 is a block diagram showing a structure of a double-loop type frequency synthesizer.

FIG. 6 shows a structure of the double-loop type frequency synthesizer described in the background section. The double-loop type frequency synthesizer includes a reference oscillator 100 for producing a reference signal with a reference frequency Fstd, first and second dividers 101-1 and 101-2 having first and second dividing ratios 1/R1 and 1/R2, respectively, first and second phase comparators (θ's) 102-1 and 102-2, first and second loop filters (LF's) 103-1 and 103-2, first and second voltage-controlled oscillators (VCO1, VCO2) 104-1 and 104-2, first and second branching filters 105-1 and 105-2, an amplifier 106, a mixer 107, a band pass filter (BPF) 108, first and second amplifiers 109-1 and 109-2, and first and second variable dividers 110-1 and 110-2 having first and second variable dividing ratios 1/N1 and 1/N2, respectively.

The reference signal with the reference frequency Fstd outputted from the reference oscillator 100 is divided by the first and second dividers 101-1 and 101-2 to be first and second divided signals having first and second divided frequencies Fstd/R1 and Fstd/R2, respectively, which are then fed to the first and second phase comparators 102-1 and 102-2, respectively. To the first and second phase comparators 102-1 and 102-2 are fed first and second variable divided signals from the first and second variable dividers 110-1 and 110-2, respectively. The first phase comparator 102-1 compares in phase the first divided signal and the first variable divided signal and outputs a first phase error signal. Similarly, the second phase comparator 102-1 compares in phase the second divided signal and the second variable divided signal and outputs a second phase error signal. The first and second phase error signals are converted by the first and second loop filters 103-1 and 103-2 into first and second controlled voltage signals, respectively, which are then fed to the first and second voltage-controlled oscillators 104-1 and 104-2, respectively. In response to the first and second controlled voltage signals, the first and second voltage-controlled oscillators 104-1 and 104-2 output first and second voltage-controlled signals, respectively. The first voltage-controlled signal is branched into two through the first branching filter 105-1, one of which is amplified by the amplifier 106 and outputted as an output signal having an output frequency fout.

The second voltage-controlled signal is branched into two through the second branching filter 105-2, one of which is fed to the mixer 107. To the mixer 107 is also fed the other of the signals branched by the first branching filter 105-1. The mixer 107 mixes these two signals to output a mixed signal. The mixed signal passes through the band pass filter 108 and, after amplified at the first amplifier 109-1, is fed to the first variable divider 110-1. The first variable divider 110-1 divides the output from the first amplifier 109-1 with the first variable dividing ratio 1/N1 and outputs the foregoing first variable divided signal. On the other hand, the other of the signals branched by the second branching filter 105-2 is amplified through the second amplifier 109-2 and then fed to the second variable divider 110-2. The second variable divider 110-2 divides the output from the second amplifier 109-2 with the second variable dividing ratio 1/N2 and outputs the foregoing second variable divided signal.

The detailed operation of the double-loop type frequency synthesizer shown in FIG. 6 is described in Prior Art 1. The double-loop type frequency synthesizer shown in FIG. 6 can realize a frequency step Δ f given by:

$$\Delta f = \text{Fstd}(1/R1 - 1/R2).$$

In this case, since step frequencies of the double loops, that is, Fstd/R1 and Fstd/R2, can be set large, the phase noise can be suppressed and the frequency switching can be speeded up.

An application of the double-loop type frequency synthesizer is disclosed, for example, in Japanese First (unexamined) Patent Publication No. 61-216529

(hereinafter referred to as "Prior Art 2"). In Prior Art 2, by extracting difference frequencies of produced oscillating waves through two phase locked loops (PLL's), oscillation stabilities and S/N ratios of the PLL's are held at required values, and inductive radio-frequency channels and frequency pitches can be arbitrarily set, and further, deterioration of the relative accuracy of frequencies of a combined wave output is prevented to reduce the content of undesired high-frequency waves. Specifically, in Prior Art 2, a reference signal with a reference frequency fr from a reference oscillator is divided at first and second dividers using 1/n1 and 1/n2 (n1 and n2 are positive integers), respectively, so that signals with two different new reference frequencies fr1 and fr2 are produced. The signals with fr1 and fr2 synchronize with first and second PLL's to produce outputs with frequencies Fs1 and Fs2, respectively. These two outputs are fed to a mixer which produces a mixed output M containing a sum frequency component of and a difference frequency component between Fs1 and Fs2. A low pass filter extracts only the difference frequency component contained in the mixed output M and removes the other unnecessary high-frequency components. An output Δ Fs of the low pass filter is a combined wave having a given inductive radio frequency.

Now, preferred embodiments of the present invention will be described hereinbelow with reference to the accompanying drawings.

Figure 7:
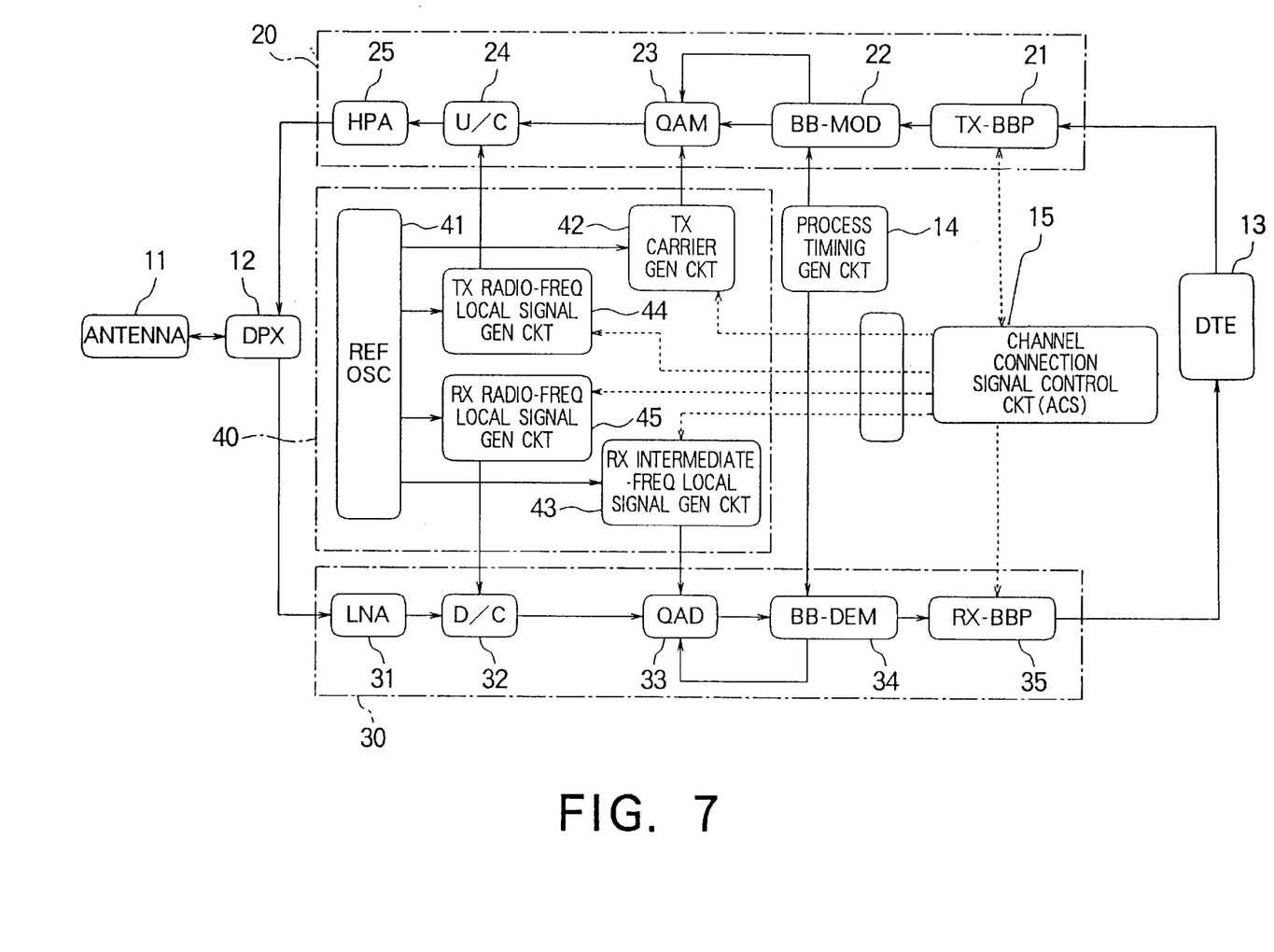
FIG. 7 is a block diagram showing a structure of a radio communication device according to a first preferred embodiment of the present invention.

FIG. 7 shows a radio communication device according to a first preferred embodiment of the present invention. The shown radio communication device has the same structure as that shown in FIG. 1 except that the frequency generating section and the channel connection signal control circuit are changed as described later. Hence, reference numerals 40 and 15 are assigned to the frequency generating section and the channel connection signal control circuit, respectively, and overlapping explanation will be omitted hereinbelow for brevity of disclosure.

The frequency generating section 40 includes a reference oscillator 41, a transmission carrier generating circuit 42, a reception intermediate-frequency local signal generating circuit 43, a transmission radio-frequency local signal generating circuit 44 and a reception radio-frequency local signal generating circuit 45. Each of the transmission carrier generating circuit 42, the reception intermediate-frequency local signal generating circuit 43, the transmist radio-frequency local signal generating circuit 44 and the reception radio-frequency local signal generating circuit 45 is in the form of a frequency synthesizer which is capable of setting a frequency channel under the control of the channel connection signal control circuit 15.

The frequency arrangement achieved by the radio communication device shown in FIG. 7 is shown in FIG. 3A. Since transmission and reception intermediate frequencies can be independently set, the degree of freedom in designing is high. The feature of the first preferred embodiment resides in that the setting of frequency channels is not performed by the single frequency signal generating circuit, but performed through cooperative operations of the transmission carrier generating circuit 42 and the transmission radio-frequency local signal generating circuit 44 in the transmitting section 20 and through cooperative operations of the reception intermediate-frequency local signal generating circuit 43 and the reception radio-frequency local signal generating circuit 45 in the receiving section 30.

Now, assuming that a step frequency of the transmission carrier generating circuit 42 is δ and a step frequency of the transmission radio-frequency local signal generating circuit 44 is Δ, setting of a transmission channel with a frequency step ε=|Δ−δ|, that is, with a frequency step of a difference between the step frequencies δ and Δ, is made possible by performing a proper control at the channel connection signal control circuit 15. If the step frequencies δ and Δ are selected to be sufficiently large, the phase noise can be made small while the frequency switching operation can be achieved at high speed. Further, if a difference between the step frequencies δ and Δ is set small, the channel setting with a small frequency step is made possible. This also applies to the operation in the receiving section 30.

Now, the operations of the transmitting section 20 and the frequency generating section 40 in the radio communication device shown in FIG. 7 will be described.

Assuming that the step frequency of the transmission carrier generating circuit 42 is δ, an intermediate frequency f[TI] of a transmit intermediate-frequency signal produced from the quadrature amplitude modulating circuit 23 becomes N·δ (N is a natural number). Similarly, if the step frequency of the transmission radio-frequency local signal generating circuit 44 is Δ, a radio frequency f[TL] of a transmit radio-frequency local signal produced therefrom becomes M·Δ (M is a natural number).

The output (transmit radio-frequency signal) of the frequency up-converter 24 contains a sum frequency component of and a difference frequency component between f[TI] and f[TL]. Here, it is considered to select the sum frequency component. An operation is essentially the same for selecting the difference frequency component. Assuming that the output frequency of the frequency up-converter 24 is f[TO], it is given by the following equation (1):

$$f[TO] = f[TL] + f[TI] \quad (1)$$
$$= M \cdot \Delta + N \cdot \delta$$
$$= f[0] + m \cdot \Delta + n \cdot \delta$$
$$= f[0] + f[m, n]$$

In the equation (1), f[0] and f[m, n] are given by the following equations (2) and (3), respectively:

$$f[0] = M_0 \cdot \Delta + N_0 \cdot \delta \quad (2)$$

$$f[m, n] = m \cdot \Delta + n \cdot \delta \quad (3)$$

wherein $M_0$ and $N_0$ are positive natural numbers, respectively, m is a positive or negative integer, n is a positive or negative integer, and f[0] is a fixed frequency.

By designating the integers m and n, a frequency channel can be set.

Now, it is assumed that the step frequency δ of the transmission carrier generating circuit 42 and the step frequency Δ of the transmission radio-frequency local signal generating circuit 44 are selected relative to the frequency step ε of the channel as given by the following equations (4) and (5), respectively:

$$\delta = 10 \cdot \epsilon \quad (4)$$

$$\Delta = 11 \cdot \epsilon \quad (5)$$

In this case, channel frequencies can be set as shown in Table 1.

TABLE 1

| m | n | f[m, n] |
|---|---|---|
| 1 | −1 | $\epsilon$ |
| 2 | −2 | $2\epsilon$ |
| 3 | −3 | $3\epsilon$ |
| −1 | 1 | $-\epsilon$ |
| −2 | 2 | $-2\epsilon$ |
| −3 | 3 | $-3\epsilon$ |

A concrete example is given below.

$\epsilon$=25 kHz
$\delta$=250 kHz
$\Delta$=275 kHz
$N_0$=280, $N_0 \cdot \delta$=70 MHz
$M_0$=5,000, $M_0 \cdot \Delta$=1,375 MHz
$f[0]=M_0 \cdot \Delta + N_0 \cdot \delta$=1,445 MHz Specifically, by cooperatively controlling the 70 MHz-band quadrature amplitude modulating circuit 23 having the step frequency $\delta$ of 250 kHz and the L-band frequency up-converter 24 having the step frequency $\Delta$ of 275 kHz, the transmitting section 20 of the radio communication device, which operates with the frequency step $\epsilon$ of 25 kHz, can be realized.

Since the operation of the receiving section 30 of the radio communication device shown in FIG. 7 is similar to the foregoing operation of the transmitting section 20, explanation thereof is omitted.

Figure 8:
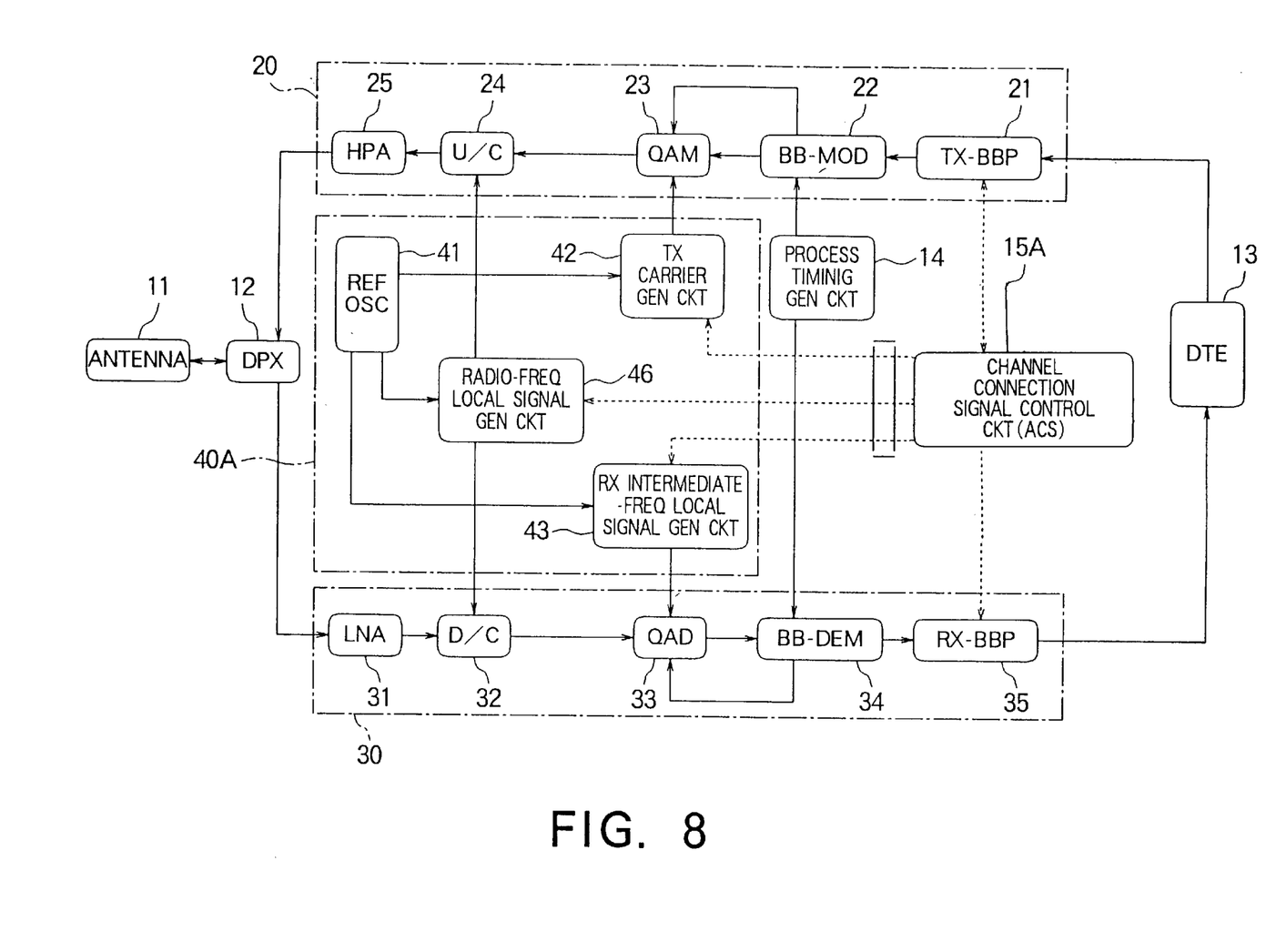
FIG. 8 is a block diagram showing a structure of a radio communication device according to a second preferred embodiment of the present invention.

FIG. 8 shows a radio communication device according to a second preferred embodiment of the present invention. The shown radio communication device has the same structure as that shown in FIG. 2 except that the frequency generating section and the channel connection signal control circuit are changed as described later. Hence, reference numerals 40A and 15A are assigned to the frequency generating section and the channel connection signal control circuit, respectively, and overlapping explanation will be omitted hereinbelow for brevity of disclosure.

Figure 3B:
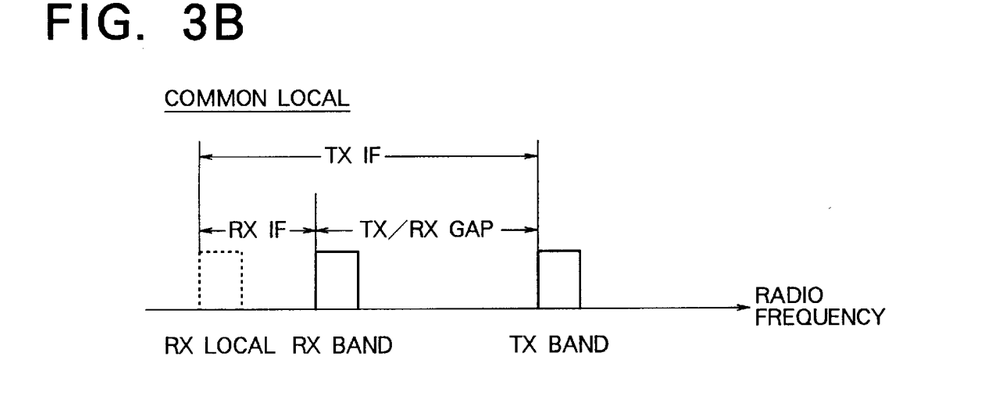

The frequency generating section 40A includes a reference oscillator 41, a transmission carrier generating circuit 42, a reception intermediate-frequency local signal generating circuit 43 and a radio-frequency local signal generating circuit 46. Each of the transmission carrier generating circuit 42, the reception intermediate-frequency local signal generating circuit 43 and the radio-frequency local signal generating circuit 46 is in the form of a frequency synthesizer which is capable of setting a frequency channel under the control of the channel connection signal control circuit 15A. In other words, the frequency generating section 40A has a structure wherein the transmission radio-frequency local signal generating circuit 44 and the reception radio-frequency local signal generating circuit 45 of the frequency generating section 40 shown in FIG. 1 are integrated as the radio-frequency local signal generating circuit 46. In the second preferred embodiment, although the structure is simplified, the freedom of independent setting of the transmission and reception intermediate frequencies is lost as shown in FIG. 3B.

Since the operation of the radio communication device shown in FIG. 8 is similar to that of the radio communication device shown in FIG. 7, explanation thereof is omitted.

Figure 9:
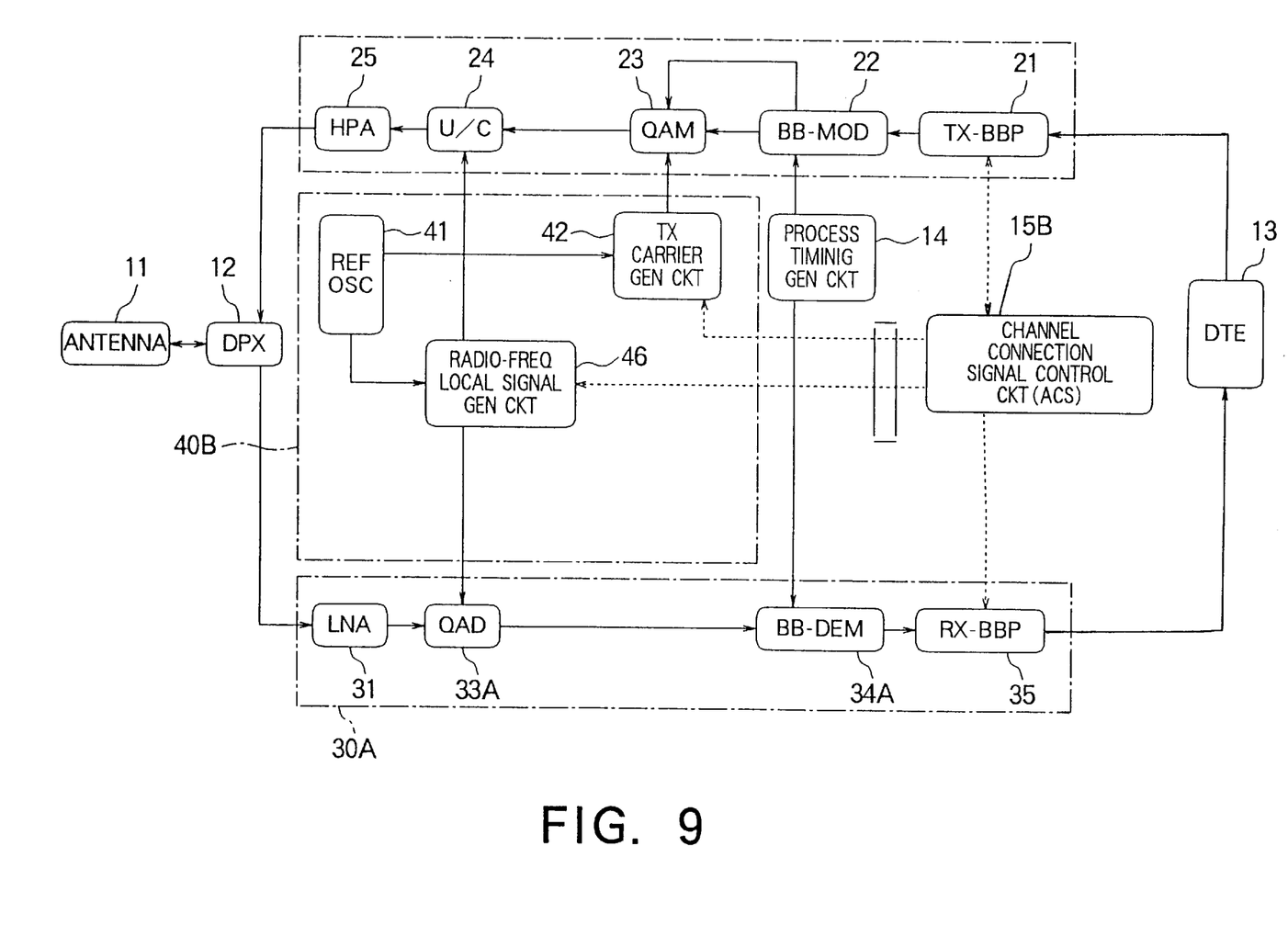
FIG. 9 is a block diagram showing a structure of a radio communication device according to a third preferred embodiment of the present invention.

FIG. 9 shows a radio communication device according to a third preferred embodiment of the present invention. The shown radio communication device has the same structure as that shown in FIG. 8 except that the frequency generating section, the channel connection signal control circuit and the receiving section are changed as described later. Hence, reference numerals 40B, 15B and 30A are assigned to the frequency generating section, the channel connection signal control circuit and the receiving section, respectively, and overlapping explanation will be omitted hereinbelow for brevity of disclosure.

The frequency generating section 40B includes a reference oscillator 41, a transmission carrier generating circuit 42 and a radio-frequency local signal generating circuit 46. Each of the transmission carrier generating circuit 42 and the radio-frequency local signal generating circuit 46 is in the form of a frequency synthesizer which is capable of setting a frequency channel under the control of the channel connection signal control circuit 15B. In other words, the frequency generating section 40B has a structure wherein the reception intermediate-frequency local signal generating section 43 in the frequency generating section 40A shown in FIG. 8 is omitted.

The receiving section 30A includes a low-noise amplifier (LNA) 31, a quadrature amplitude demodulating circuit (QAD) 33A, a baseband demodulating circuit (BB-DEM) 34A and a reception baseband processing circuit (RX-BBP) 35. To the quadrature amplitude demodulating circuit 33A is fed a radio-frequency local signal from the radio-frequency local signal generating circuit 46. Specifically, the receiving section 30A has a structure wherein the frequency down-converter 32 and the quadrature amplitude demodulating circuit 33 in the receiving section 30 shown in FIG. 8 are integrated as the quadrature amplitude demodulating circuit 33A.

Figure 3C:
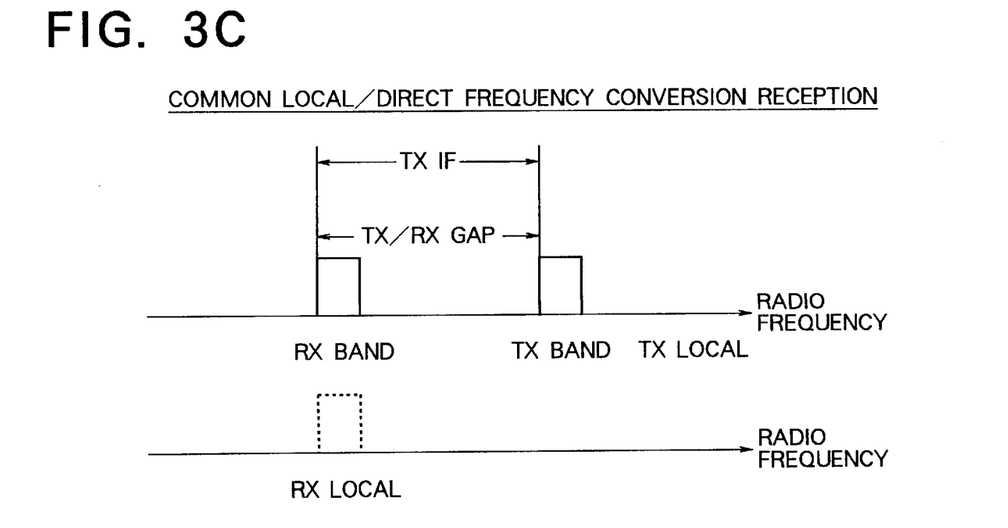

The frequency arrangement achieved by the radio communication device shown in FIG. 9 is shown in FIG. 3C.

In the third preferred embodiment, although the structure is most simplified, if a step frequency of the radio-frequency local signal generating circuit 46 is set large, the freedom in frequency conversion of the received signal with respect to 0 Hz at a baseband is lost. However, as described later, this can be easily solved through baseband signal processing in the baseband demodulating circuit 34A.

Now, the operations of the radio communication device shown in FIG. 9 will be described. Since the operation of the transmitting section 20 in FIG. 9 is the same as that of the transmitting section 20 in FIG. 7, explanation thereof is omitted.

The operation of the receiving section 30A in FIG. 9 will be described. In the receiving section 30A, since there exists only the radio-frequency local signal generating circuit 46, a frequency step becomes $\Delta$, that is, 275 kHz in the foregoing example. Accordingly, an output signal of the quadrature amplitude demodulating circuit 33A may deviate in frequency up to $\Delta/2$=137.5 kHz at maximum. This deviation in frequency can be easily corrected in the baseband demodulating circuit 34A.

It is, in principle, possible to apply a similar arrangement to the transmitting section so as to simplify the structure thereof, that is, omitting the transmission carrier generating circuit 42 and integrating the quadrature amplitude modulating circuit 23 and the frequency up-converter 24. However, it may raise a problem to omit the intermediate-frequency step in the transmitting section since the standard about undesired wave power is very strict.

According to the foregoing preferred embodiments, since both of the intermediate-frequency local signal generating circuit/circuits and the radio-frequency local signal generating circuit/circuits are in the form of the frequency synthesizers which are cooperatively controlled by the control circuit, the following effects can be achieved.

The first effect is that the radio communication device for the FDMA or TDMA/FDMA communication network, where the frequency steps are small, can be easily realized. The reason for this is that, since the channel frequency setting with a small frequency step can be achieved through cooperative control of the local signal generating circuits having large step frequencies, it is possible to provide the radio communication device with small phase noise and high-speed frequency switching.

The second effect is that the structure of the radio communication device can be simplified. The reason for this is that the foregoing first effect can be achieved with the common local signal generating circuit as shown in FIGS. 8 and 9.

While the present invention has thus far been described in connection with a few embodiments thereof, it will readily be possible for those skilled in the art to put this invention into practice in various other manners. For example, in the foregoing preferred embodiments, the present invention is applied to both the transmitting and receiving sections. However, the present invention may be applied to only the transmitting or receiving section.

What is claimed is:

1. A radio communication device comprising:

a carrier generating circuit for generating a transmit carrier signal, said carrier generating circuit comprising a first frequency synthesizer capable of varying an intermediate frequency of said transmit carrier signal using a first step frequency;

a radio-frequency local signal generating circuit for generating a radio-frequency local signal, said radio-frequency local signal generating circuit comprising a second frequency synthesizer capable of varying a radio frequency of said radio-frequency local signal using a second step frequency different from said first step frequency;

a transmitting section connected to said carrier generating and said radio-frequency local signal generating circuits for generating a transmit radio-frequency signal in response to said transmit carrier signal and said radio-frequency local signal with a frequency up-conversion to transmit said transmit radio-frequency signal; and a control circuit connected to said first and said second frequency synthesizers for cooperatively controlling said first and said second frequency synthesizers so as to allow a transmission channel to be set with a frequency step equal to a difference between said first and said second step frequencies.

2. A radio communication device as claimed in claim 1, wherein said transmitting section comprises:

modulating means connected to said said carrier generating circuit for modulating said transmit carrier signal with a transmit baseband signal to produce a transmit intermediate-frequency signal; and performing means connected to said modulating means for performing said frequency up-conversion as regards said transmit intermediate-frequency signal using a radio-frequency local signal to produce said transmit radio-frequency signal;

means connected to said performing means for transmitting said transmit radio-frequency signal.

3. A radio communication device as claimed in claim 1, wherein said transmission channel is set with said frequency step.

4. A radio communication device comprising:

a radio-frequency local signal generating circuit for generating a radio-frequency local signal, said radio-frequency local signal generating circuit comprising a first frequency synthesizer capable of varying a radio frequency of said radio-frequency local signal using a first step frequency;

a reception intermediate-frequency local signal generating circuit for generating a receive intermediate-frequency local signal, said reception intermediate-frequency local signal generating circuit comprising a second frequency synthesizer capable of varying an intermediate frequency of said receive intermediate frequency local signal using a second step frequency different from said first step frequency;

a receiving section connected to said radio-frequency local signal generating and said reception intermediate-frequency local signal generating circuits for receiving a receive radio-frequency signal to produce a receive baseband signal in response to said radio-frequency local signal and said receive intermediate-frequency local signal with a frequency down-conversion of said receive radio-frequency signal; and a control circuit connected to said first and said second frequency synthesizers for cooperatively controlling said first and said second frequency synthesizers so as to allow a reception channel to be set with a frequency step equal to a difference between said first and said second step frequencies.

5. A radio communication device as claimed in claim 4, wherein said receiving section comprises:

receiving means for receiving said receive radio-frequency signal;

performing means connected to said receiving means for performing said frequency down-conversion as regards said receive radio-frequency signal using a radio-frequency local signal to produce a receive intermediate-frequency signal; and demodulating means connected to performing means for demodulating said receive intermediate-frequency signal using a receive intermediate-frequency local signal to produce said receive baseband signal.

6. A radio communication device as claimed in claim 4, wherein said reception channel is set with said frequency step.

7. A radio communication device comprising:

a transmission carrier generating circuit for generating a transmit carrier signal, said transmission carrier generating circuit comprising a first frequency synthesizer capable of carrying an intermediate frequency of said transmit carrier signal using a first step frequency;

a radio-frequency local signal generating circuit for generating a radio-frequency local signal, said radio-frequency local signal generating circuit comprising a second frequency synthesizer capable of varying a radio frequency of said radio-frequency local signal using a second step frequency different from said first step frequency;

a transmitting section for modulating said transmit carrier signal with a transmit baseband signal to produce a transmit intermediate-frequency signal, performing a frequency up-conversion of said transmit intermediate-frequency signal using said radio-frequency local signal to produce a transmit radio-frequency signal and transmitting said transmit radio-frequency signal;

a receiving section for receiving a receive radio-frequency signal and demodulating said receive radio-frequency signal using said radio-frequency local signal to produce a receive baseband signal; and a control circuit connected to said first and said second frequency synthesizers for controlling said first and said second frequency synthesizers so as to allow a transmission channel to be set with a frequency step equal to a difference between said first and said second step frequencies, while allowing a reception channel to be sent with a reception frequency step equal to said second step frequency.

8. A radio communication device as claimed in claim 7, wherein said receiving section receives said receive radio-frequency signal, performs a frequency down-conversion of said receive radio-frequency signal using said radio-frequency local signal to produce a receive intermediate-frequency signal, and demodulates said receive intermediate-frequency signal using a receive intermediate-frequency local signal to produce said receive baseband signal.

9. A radio communication device as claimed in claim 8, further comprising a reception intermediate-frequency local signal generating circuit for generating said receive intermediate-frequency local signal, said reception intermediate-frequency local signal generating circuit comprising a third frequency synthesizer capable of varying an intermediate frequency of said receive intermediate-frequency local signal using a third step frequency different from said second step frequency, said control circuit being further connected to said third frequency synthesizer further for controlling said third frequency synthesizer together with said first and said second frequency synthesizers.

10. A radio communication device as claimed in claim 9, wherein said control circuit cooperatively controls said first, said second, and said third frequency synthesizer together.

11. A radio communication device as claimed in claim 9, wherein said radio-frequency local signal generating circuit comprises:

a transmission radio-frequency local signal generating circuit for generating said transmit radio-frequency local signal, said transmission radio-frequency local signal generating circuit comprising a transmission frequency synthesizer capable of varying a radio frequency of said transmit radio-frequency local signal using a transmission step frequency different from said first step frequency; and a reception radio-frequency local signal generating circuit for generating said receive radio-frequency local signal, said reception radio-frequency local signal generating circuit comprising a reception frequency synthesizer capable of varying a radio frequency of said receive radio-frequency local signal using a reception step frequency different from said third step frequency.

12. A radio communication device as claimed in claim 11, wherein said control circuit is further connected to said transmission frequency synthesizer and said reception frequency synthesizer further for controlling said first frequency synthesizer and said transmission frequency synthesizer and for controlling said reception frequency synthesizer and said third frequency synthesizer.

* * * * *